(12) United States Patent
Chung

(10) Patent No.: US 6,642,139 B1
(45) Date of Patent: Nov. 4, 2003

(54) METHOD FOR FORMING INTERCONNECTION STRUCTURE IN AN INTEGRATION CIRCUIT

(75) Inventor: Henry Chung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/187,134

(22) Filed: Jun. 28, 2002

(51) Int. Cl.⁷ .......................................... H01L 21/4763
(52) U.S. Cl. ....................... 438/622; 438/629; 438/633; 438/637
(58) Field of Search ................................. 438/629, 633, 438/637, 622, 626

(56) References Cited

U.S. PATENT DOCUMENTS

| | | | | |
|---|---|---|---|---|
| 5,275,973 A | * | 1/1994 | Gelatos | 438/631 |
| 5,739,579 A | * | 4/1998 | Chiang et al. | 438/624 |
| 6,033,977 A | * | 3/2000 | Gutsche et al. | 438/618 |
| 6,080,674 A | * | 6/2000 | Wu et al. | 438/692 |
| 6,096,655 A | * | 8/2000 | Lee et al. | 438/700 |
| 6,403,461 B1 | * | 6/2002 | Tae et al. | 438/619 |
| 6,486,557 B1 | * | 11/2002 | Davis et al. | 257/758 |
| 2002/0055275 A1 | * | 5/2002 | MacNeil | 438/798 |

OTHER PUBLICATIONS

Wolf, S., Silicon Processing for the VLSI Era, vol. 2, Lattice Press, 1990, 194–199, 214–238.*

* cited by examiner

Primary Examiner—T. N. Quach

(57) ABSTRACT

A method for fabricating vias and trenches in a dual-damascene multilevel interconnection structure of an integration circuit is provided. The method uses chemical vapor deposition and flowfill dielectric technology to deposit a dielectric material at low temperature for fabricating interconnection structure in an integration circuit. It comprises the following steps: (a) forming photo-resist patterns; (b) depositing a dielectric layer at low temperature by chemical vapor deposition and flowfill dielectric technologies; (c) removing the dielectric layer by chemical-mechanical polishing to expose the photo-resist patterns; (d) removing the photo-resist patterns by chemical-mechanical polishing; and (e) stabilizing the dielectric layer by thermal curing.

9 Claims, 5 Drawing Sheets

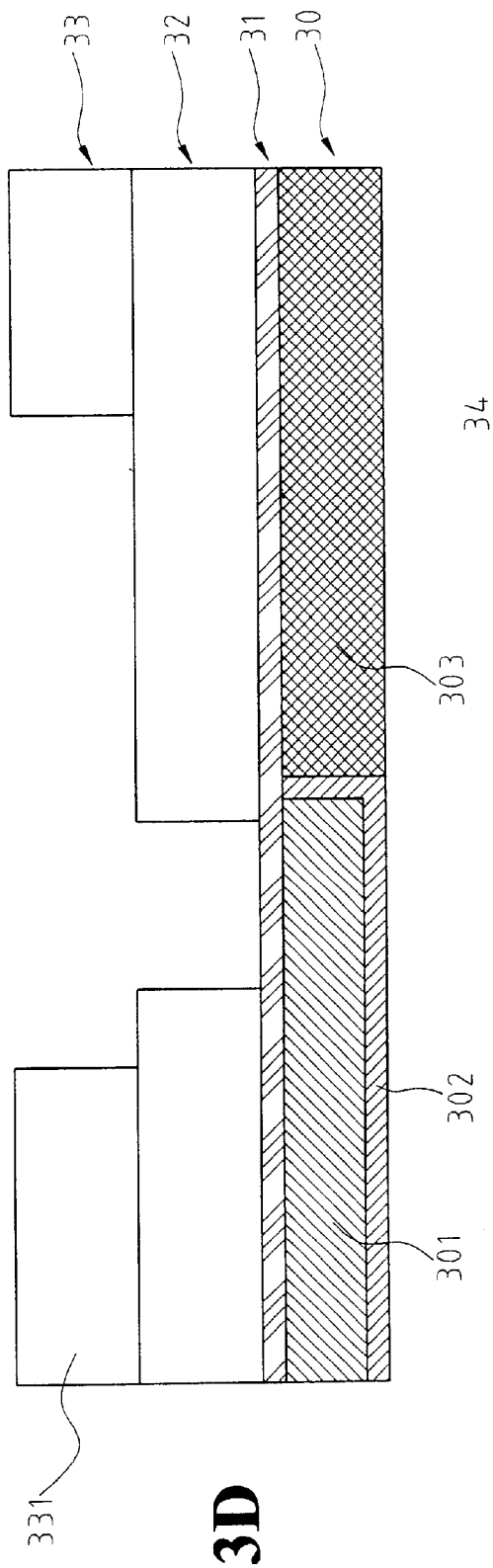
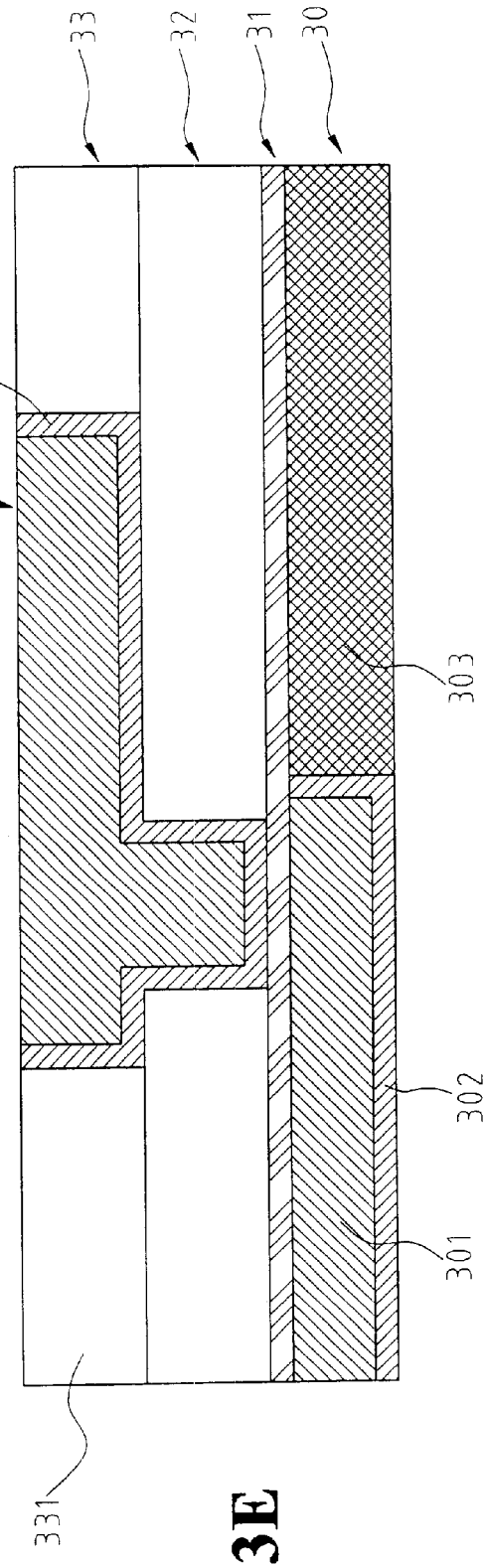
FIG. 3D
FIG. 3E

METHOD FOR FORMING INTERCONNECTION STRUCTURE IN AN INTEGRATION CIRCUIT

FIELD OF THE INVENTION

The present invention generally relates to a method for fabricating interconnection structure in an integration circuit, and more specifically to a method for fabricating vias and trenches in a dual-damascene multilevel interconnection structure of an integration circuit.

BACKGROUND OF THE INVENTION

Wiring trenches and via holes are formed conventionally in the inter-layer insulating materials for multilevel metal interconnection microelectronics. To simplify the manufacturing process, both the vias and trenches are formed by a single process step. This single process step is called a "dual-damascene" process. When trench patterns are etched before etching the via holes, the process is called a "trench-first" dual-damascene process. On the other hand, when via holes are etched before the etch of the trench patterns, the process sequence is called "via-first". Trenches and vias are formed conventionally by removing dielectric material being deposited on a dielectric layer using a plasma-etching method in a semiconductor manufacturing process. However, this method has some difficulties, especially in a dual-damascene process for multilevel metal interconnection microelectronics no matter whether the via-first or trench-first method is used. If only a single dielectric layer is used as the inter-metal dielectric (IMD) layer in a via-first or trench-first dual-damascene process without using any etch stop layer (ESL), then the manufacturing result is poor. Therefore, etch stop layers are commonly used as the inter-metal dielectric layers in a conventional dual-damascene process. However, adding etch stop layers greatly increases not only the processing steps but also the complexity of the dual-damascene process. Moreover, because the etch stop layer usually uses a material of high dielectric constant, the performance of the semiconductor device is degraded.

U.S. Pat. No. 6,096,655 discloses a method for forming vias and trenches in an insulation layer for a dual-damascene multilevel interconnection structure. It comprises the following steps: depositing a first sacrificial layer, etching the sacrificial layer, depositing a first inter insulation layer, depositing a second sacrificial layer, depositing a second inter insulation layer, and selectively etching the second sacrificial layer and forming vias and trenches simultaneously. Referring to FIGS. 1a–1g, this method uses reversed via and trench patterns in the inter-insulation layer for a dual-damascene process to replace commonly used masks. As shown in FIG. 1a, a silicon film of polycrystalline or amorphous used as a sacrificial layer 12 is deposited over a dielectric layer 11 on a substrate 10. A photo-resist mask 13 is deposited to form a reverse pattern of the vias as shown in FIG. 1b. Thereafter, a reactive ion etch (RIE) process is used to etch the sacrificial layer 12 leaving behind sacrificial pillars beneath the photo-resist mask 13 as shown in FIG. 1c. In FIG. 1d, the photo-resist mask 13 is then removed. In FIG. 1e, an inter insulation layer 14 is deposited. Then the inter insulation layer 14 is planarized by either etch back or chemical-mechanical polishing (CMP) to make the top surface of the inter insulation layer 14 flush with the top, surface of the sacrificial layer 12 as shown in FIG. 1f. Finally, the sacrificial layer 12 is removed to form a vias or trench structure.

As can be seen from the above-mentioned prior art, it is necessary to deposit a silicon film of polycrystalline or amorphous as a sacrificial layer in the fabricating process. In order to increase the performance of the semiconductor device, the above-mentioned prior art or other conventional methods for fabricating a dual-damascene multilevel interconnection structure unavoidably have to use two dielectric layers and an etch stop layer between them.

SUMMARY OF THE INVENTION

This invention has been made to overcome the above-mentioned drawback of a conventional method for fabricating an interconnection structure. The primary object of this invention is to provide a method for fabricating vias and trenches in a dual-damascene multilevel interconnection structure of an integration circuit. In addition, the manufacturing method of the invention can be used not only in the dual-damascene process but also in other semiconductor interconnection processes.

According to the invention, the method for fabricating interconnection structure in an integration circuit comprises the following steps: (a) forming photo-resist patterns by providing a substrate and depositing a photo-resist layer on the substrate, wherein a first dielectric layer can be deposited on the substrate before depositing the photo-resist layer, (b) depositing a second dielectric layer at low temperature, (c) removing the second dielectric layer by chemical-mechanical polishing to remove the portion of the second dielectric layer that covers the photo-resist patterns and to expose the photo-resist patterns, (d) removing the photo-resist patterns, and (e) stabilizing the second dielectric layer by thermal curing.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

FIGS. 3A–3E show a preferred embodiment of the invention that fabricates via holes and trenches.

DETAILED DESCRIPTION OF THE INVENTION

The present invention is provided to avoid depositing the sacrificial layer in the conventional dual-damascene process. The difficulty of depositing the sacrificial layer is that the temperature required to form the sacrificial layer which is made of a dielectric material is much higher than the temperature required to keep the photo-resist stable in terms of physical, mechanical and chemical properties. Usually, the photo-resist is stable below about 100° C. and the typical temperature for forming the dielectric material is as high as 350° C. In other words it is difficult to deposit a dielectric material on a photo-resist layer. Therefore, it is necessary to select a stable sacrificial layer for via and trench structure. Nowadays, the technology for depositing a dielectric material at low temperature has been developed. For instance, Trikon Technologies Ltd bas developed a so-called "flowfill dielectric technology" to deposit a dielectric material at 0° C. by a carbon-containing silicon-based oxide.

Figure 1A:
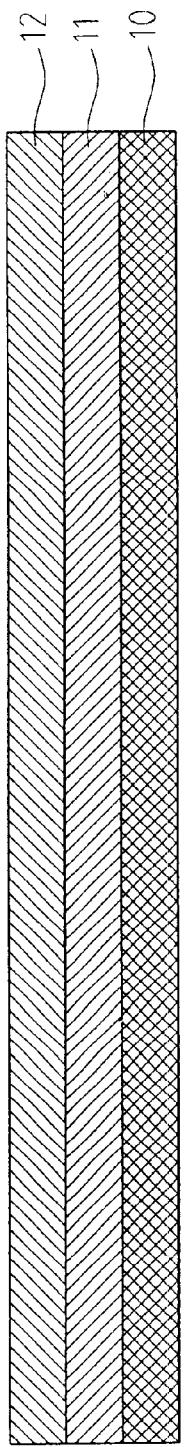
FIGS. 1A–1G show a conventional method for fabricating vias and trenches.
Figure 1B:
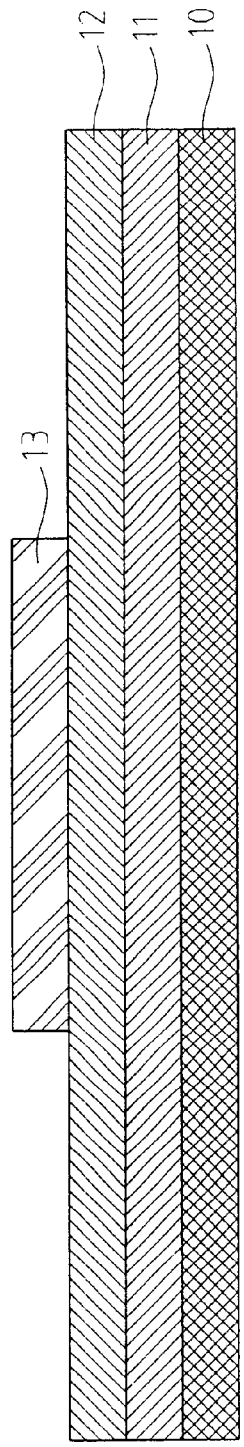
Figure 1C:
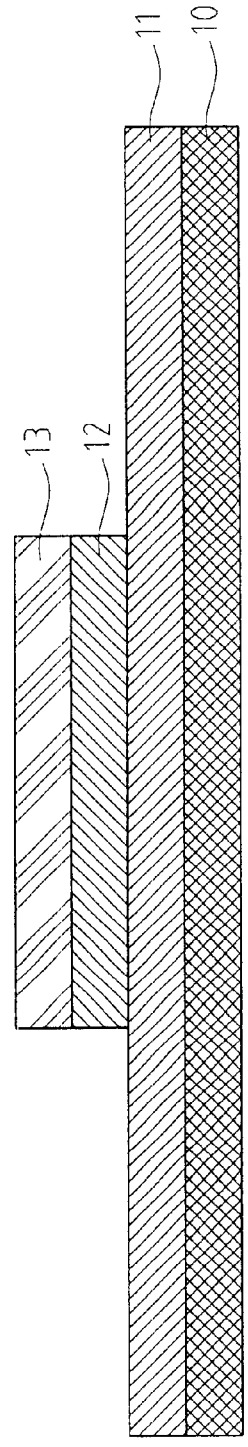
Figure 1D:
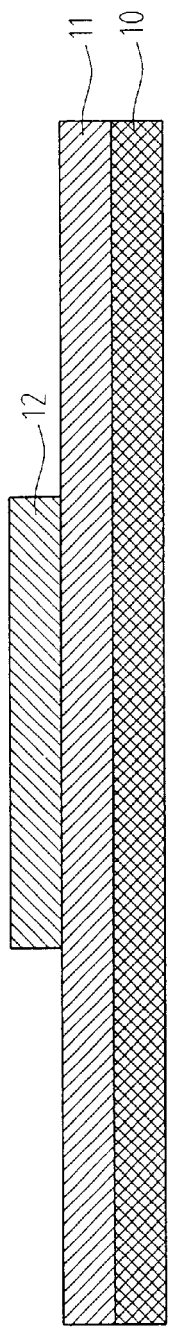
Figure 1E:
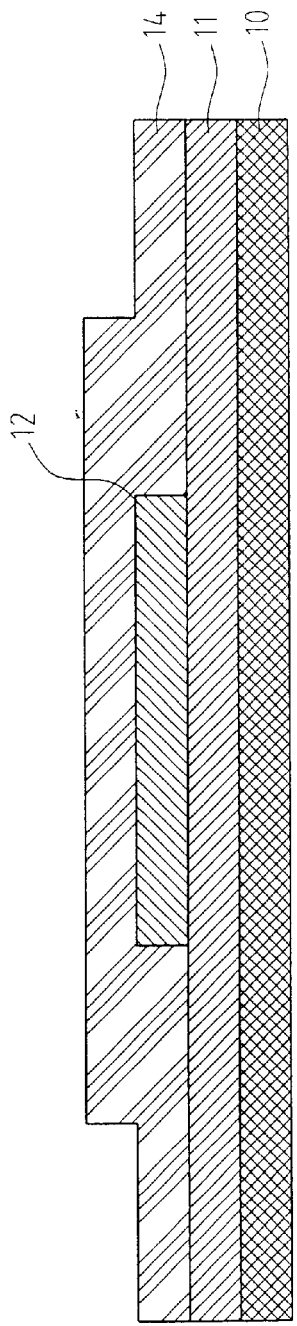
Figure 1F:
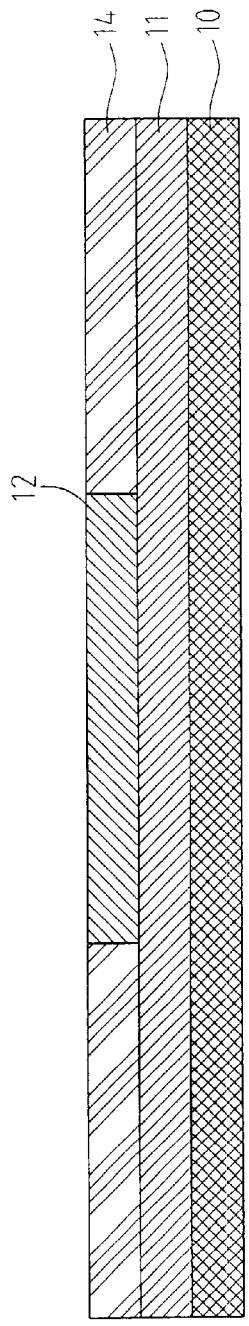
Figure 1G:
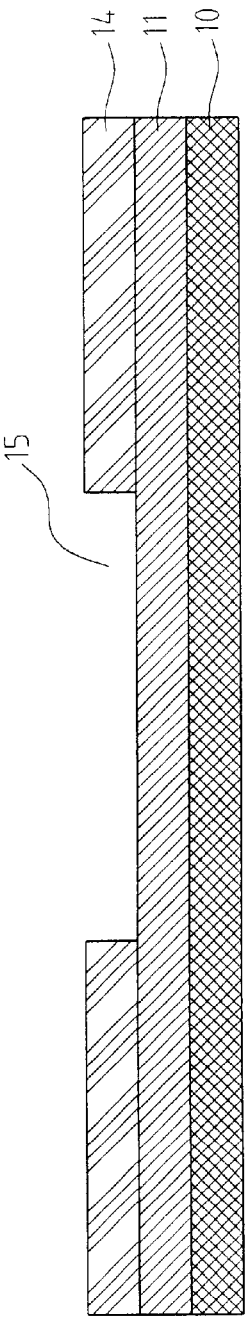
Figure 2A:
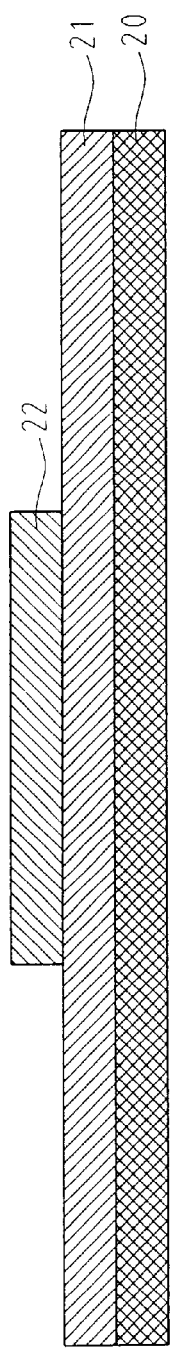
FIGS. 2A–2D show a method for fabricating vias and trenches in a dual-damascene multilevel interconnection structure of an integration circuit according to the present invention.
Figure 2B:
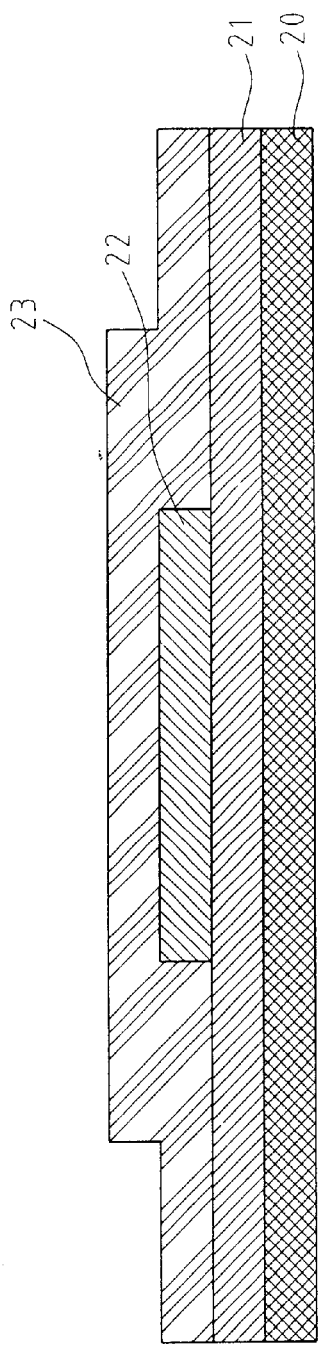
Figure 2C:
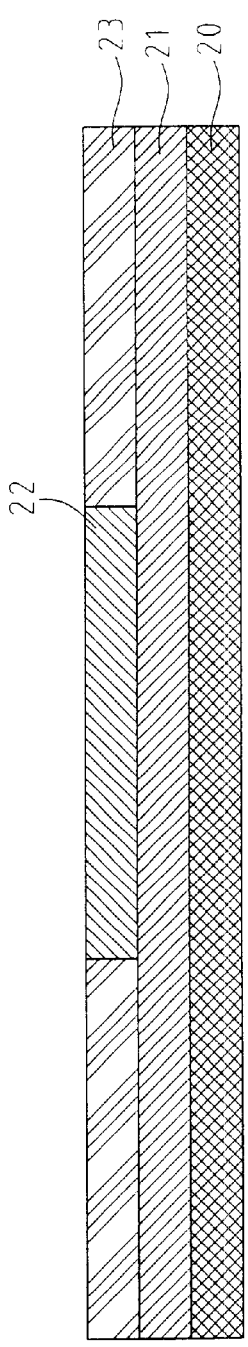
Figure 2D:
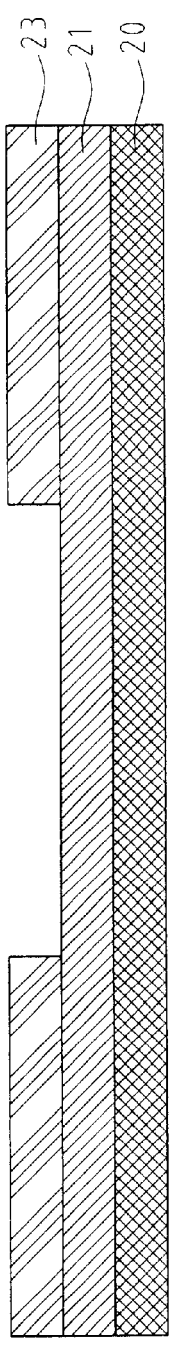

This invention uses the flowfill dielectric technology to deposit a dielectric material at a low temperature for fabricating the interconnection structure in an integration circuit. With reference to FIGS. 2a–2d, the method for fabricating the interconnection structure in an integration circuit according to this invention first forms photo-resist patterns by providing a substrate 20 and depositing a photo-resist layer on the substrate 20. Before depositing the photo-resist layer, a first dielectric layer 21 can be deposited on the substrate 20. Then a photo-resist layer is spin-coated over the first dielectric layer 21 followed by baking, exposing and developing the photo-resist layer. The photo-resist patterns 22 are formed as shown in FIG. 2a. A second dielectric layer 23 is then deposited at a low temperature by chemical vapor deposition (CVD) and flowfill dielectric technologies as shown in FIG. 2b. The temperature can be controlled under the temperature that keeps the physical, mechanical and chemical properties of the photo-resist patterns 22 stable. The temperature is about 40° C. to avoid destroying the photo-resist patterns. The second dielectric layer 23 is partially removed by chemical-mechanical polishing to remove the portion of the second dielectric layer 23 that covers the photo-resist patterns 22 and to expose the photo-resist patterns 22 as shown in FIG. 2c. Finally, the photo-resist patterns 22 are removed by chemical-mechanical polishing as shown in FIG. 2d, and the second dielectric layer 23 is stabilized by thermal curing.

Figure 3A:
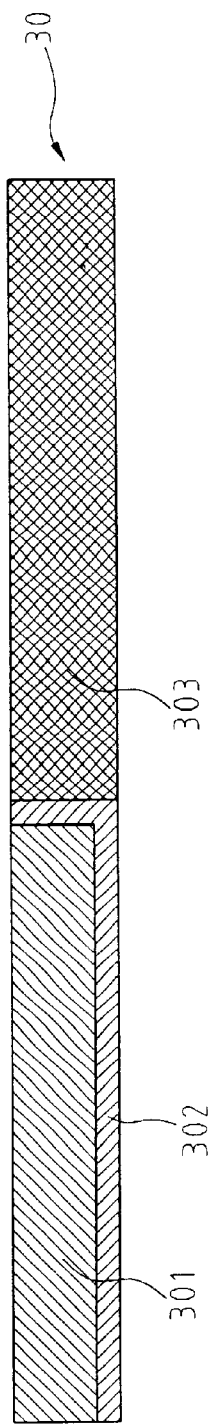
Figure 3B:
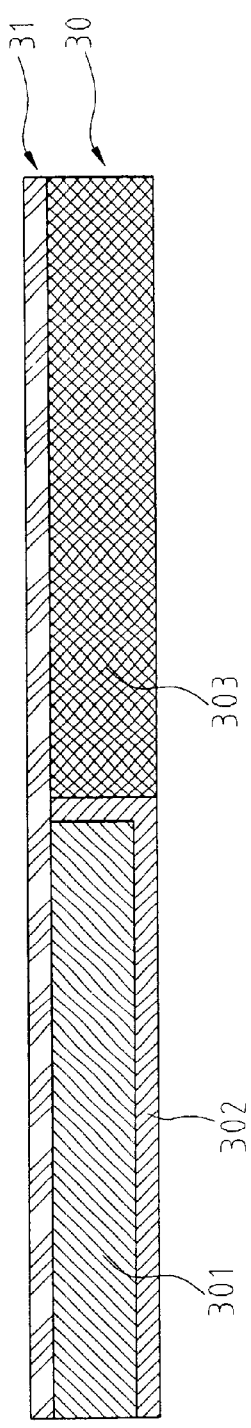
Figure 3C:
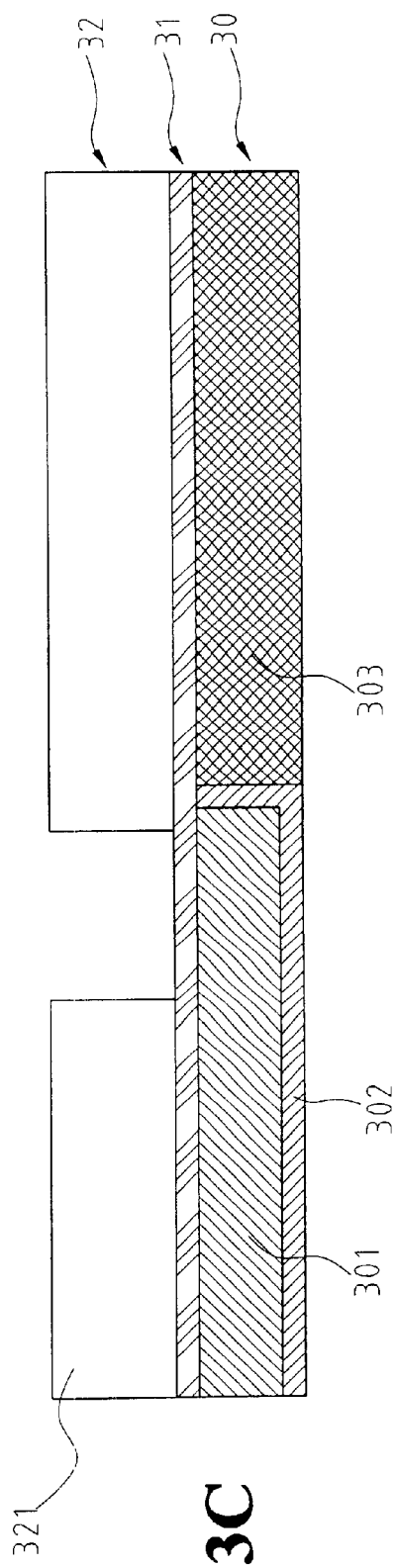

In order to simplify the fabricating process for a dual-damascene multilevel interconnection structure, FIGS. 3a–3e show a preferred embodiment of the invention that forms via holes and trenches of an interconnection structure on a substrate. The first step of the process is to provide a substrate 30 with a first metal conductor layer 301 and a first inter-metal dielectric layer 303 deposited thereon. Referring to FIG. 3a, a first barrier metal layer 302 is formed between the first metal conductor layer 301 and the first inter-metal dielectric layer 303. The material for the first metal conductor layer 301 can be copper (Cu). A first barrier dielectric layer 31 is formed to cover the first barrier metal layer 302 as well as the first inter-metal dielectric layer 303 as shown in FIG. 3b. As shown in FIG. 3c, the via patterns 32 are then formed by the above-mentioned method according to this invention. To form the via patterns, a layer of photo-resist via patterns is formed by coating the photo-resist on the surface of the first barrier dielectric layer 31. A second dielectric layer 321 is deposited at low temperature. The second dielectric layer 321 is partially removed by chemical-mechanical polishing to remove the portion of the second dielectric layer 321 that covers the photo-resist via patterns and to expose the photo-resist via patterns. The exposed photo-resist via patterns are then removed, and the second dielectric layer 321 is stabilized by thermal curing to get the via patterns 32, as shown in FIG. 3c. After the via patterns are formed, trench patterns 33 are formed by the above-mentioned method according to this invention. To form the trench patterns, a layer of photo-resist trench patterns is formed by coating the photo-resist on the surface of the second dielectric layer 321. A third dielectric layer 331 is deposited at low temperature. The third dielectric layer 331 is partially removed by chemical-mechanical polishing to remove the portion of the third dielectric layer 331 that covers the photo-resist trench patterns and to expose the photo-resist trench patterns. The exposed photo-resist trench patterns are then removed, and the third dielectric layer 331 is stabilized by thermal curing to get the trench patterns 33, as shown in FIG. 3d. Finally, a second metal conductor layer 34 is used to fill the vias and the trenches. Before filling the second metal conductor layer 34, a second barrier metal layer 341 can be formed by the side and on the bottom surfaces of the vias and trenches as shown in FIG. 3e, The material for the second metal conductor layer 34 can be copper.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method for fabricating interconnection structure in an integration circuit comprising the steps of:
   forming photo-resist patterns by providing a substrate and depositing a photo-resist layer on said substrate;
   depositing a dielectric layer at a temperature of approximately 40° C. by chemical vapor deposition;
   removing said dielectric layer by chemical-mechanical polishing to remove the portion of said dielectric layer that covers said photo-resist patterns and to expose said photo-resist patterns;
   removing said exposed photo-resist patterns; and
   curing said dielectric layer.

2. The method for fabricating interconnection structure in an integration circuit as claimed in claim 1, wherein a first dielectric layer is deposited on said substrate before depositing said photo-resist layer.

3. The method for fabricating interconnection structure in an integration circuit as claimed in claim 1, said photo-resist patterns being formed by spin-coating a layer of photo-resist, followed by baking, exposing and developing said photo-resist layer.

4. A method for fabricating dual-damascene multilevel interconnection structure comprising the steps of:
   providing a substrate with a first metal conductor layer and a first inter-metal dielectric layer deposited thereon and a first barrier metal layer being formed between said first metal conductor layer and said first inter-metal dielectric layer;
   forming a first barrier dielectric layer on the top surface of said substrate to cover said first metal conductor layer, said first inter-metal dielectric layer and said first barrier metal layer;
   forming via patterns using a method comprising the steps of:
      forming a layer of photo-resist via patterns by coating photo-resist on the surface of said first barrier dielectric layer;
      depositing a second dielectric layer;
      removing said second dielectric layer by chemical-mechanical polishing to remove the portion of said second dielectric layer that covers said photo-resist via patterns and to expose said photo-resist via patterns;
      removing said exposed photo-resist via patterns; and
      curing said second dielectric layer by thermal curing;
   forming trench patterns; and
   filling a second metal conductor layer.

5. The method for fabricating dual-damascene multilevel interconnection structure as claimed in claim 4, wherein the step of forming said trench patterns in further comprises the steps of:

forming a layer of photo-resist trench patterns by coating photo-resist on the surface of said second dielectric layer;

depositing a third dielectric layer;

removing said third dielectric layer by chemical-mechanical polishing to remove the portion of said third dielectric layer that covers said photo-resist trench patterns and to expose said photo-resist trench patterns;

removing said exposed photo-resist trench patterns; and curing said third dielectric layer by thermal curing.

6. The method for fabricating dual-damascene multilevel interconnection structure as claimed in claim 5, wherein said third dielectric layer is deposited at a temperature of approximately 40° C. by chemical vapor deposition.

7. The method for fabricating dual-damascene multilevel interconnection structure as claimed in claim 4, wherein the material for the first and second metal conductor layers is copper.

8. The method for fabricating dual-damascene multilevel interconnection structure as claimed in claim 4, wherein a second barrier metal layer is formed by the side and on the bottom surfaces of said vias and trenches before filling said second metal conductor layer.

9. The method for fabricating dual-damascene multilevel interconnection structure as claimed in claim 4, wherein said second dielectric layer is deposited at a temperature of approximately 40° C. by chemical vapor deposition.

* * * * *